United States Patent
Nishigaki et al.

(10) Patent No.: US 10,466,303 B2
(45) Date of Patent: Nov. 5, 2019

(54) STATE-OF-CHARGE ESTIMATION DEVICE AND STATE-OF-CHARGE ESTIMATION METHOD

(71) Applicant: KABUSHIKI KAISHA TOYOTA JIDOSHOKKI, Aichi (JP)

(72) Inventors: Kenji Nishigaki, Kariya (JP); Masashi Kidono, Kariya (JP); Takahiro Tsuzuku, Kariya (JP); Hiroyuki Nomura, Kariya (JP)

(73) Assignee: KABUSHIKI KAISHA TOYOTA JIDOSHOKKI, Aichi (JP)

( * ) Notice: Subject to any disclaimer, the term of this patent is extended or adjusted under 35 U.S.C. 154(b) by 464 days.

(21) Appl. No.: 14/760,830

(22) PCT Filed: Oct. 25, 2013

(86) PCT No.: PCT/JP2013/079025
§ 371 (c)(1),
(2) Date: Jul. 14, 2015

(87) PCT Pub. No.: WO2014/112175
PCT Pub. Date: Jul. 24, 2014

(65) Prior Publication Data
US 2015/0355285 A1 Dec. 10, 2015

(30) Foreign Application Priority Data
Jan. 21, 2013 (JP) .................. 2013-008171

(51) Int. Cl.
*G01R 31/367* (2019.01)
*G01R 31/388* (2019.01)
(Continued)

(52) U.S. Cl.
CPC .............. *G01R 31/367* (2019.01); *B60L 3/12* (2013.01); *B60L 58/12* (2019.02); *G01R 31/388* (2019.01);
(Continued)

(58) Field of Classification Search
CPC .................................................. H02J 7/0047
See application file for complete search history.

(56) References Cited

U.S. PATENT DOCUMENTS 5,612,608 A   3/1997   Ishiguro et al.
6,232,744 B1*  5/2001   Kawai ...................... B60K 6/28
                                                 180/65.235
(Continued)

FOREIGN PATENT DOCUMENTS

DE        69917036       4/2005
DE     102005026597    12/2006
(Continued)

OTHER PUBLICATIONS

International Search Report for PCT/JP2013/079025 dated Dec. 17, 2013.
(Continued)

*Primary Examiner* — Robert Grant
*Assistant Examiner* — Tynese V McDaniel
(74) *Attorney, Agent, or Firm* — Greenblum & Bernstein, P.L.C.

(57) ABSTRACT

A state-of-charge estimation device and a state of charge estimation method are provided that estimate a state of charge in a battery having a large polarization, requiring a long time for depolarization, and having a large charge/discharge hysteresis in its SOC-OCV characteristics. The state-of-charge estimation device includes a voltage measuring unit which measures a closed circuit voltage in a battery, a charge estimation unit which estimates a state of charge in a charge mode by referring to charge mode information that associates a closed circuit voltage with a state of charge in the battery, and a discharge estimation unit which estimates a state of charge in a discharge mode by referring to discharge mode information that associates a closed circuit voltage generated by use of a discharge pattern of the battery with a state of charge in the battery by use of the measured closed circuit voltage.

3 Claims, 8 Drawing Sheets

(51) Int. Cl.
    *G01R 31/3835* (2019.01)
    *H01M 10/48* (2006.01)
    *B60L 3/12* (2006.01)
    *B60L 58/12* (2019.01)
    *H01M 4/48* (2010.01)
    *H01M 10/0525* (2010.01)

(52) U.S. Cl.
    CPC ........ *G01R 31/3835* (2019.01); *H01M 10/48* (2013.01); *B60L 2240/547* (2013.01); *B60L 2240/549* (2013.01); *B60L 2260/44* (2013.01); *H01M 4/483* (2013.01); *H01M 10/0525* (2013.01); *H01M 2220/20* (2013.01); *Y02E 60/122* (2013.01); *Y02T 10/7005* (2013.01); *Y02T 10/705* (2013.01); *Y02T 10/7044* (2013.01)

(56) References Cited

U.S. PATENT DOCUMENTS

| | | | |
|---|---|---|---|
| 6,359,419 B1 | 3/2002 | Verbrugge et al. | |
| 2002/0113595 A1* | 8/2002 | Sakai | B60K 6/445 324/433 |
| 2006/0091861 A1* | 5/2006 | Melichar | B60L 11/1861 320/132 |
| 2006/0091862 A1* | 5/2006 | Melichar | G01R 31/3648 320/132 |
| 2006/0091863 A1* | 5/2006 | Melichar | G01R 31/361 320/132 |
| 2006/0152196 A1 | 7/2006 | Matsumoto et al. | |
| 2008/0135801 A1* | 6/2008 | Kizaki | H01M 4/0471 252/182.1 |
| 2011/0033735 A1* | 2/2011 | Kinoshita | H01M 10/052 429/90 |
| 2012/0166116 A1* | 6/2012 | Yoshida | G01R 31/3624 702/63 |
| 2013/0138370 A1* | 5/2013 | Oh | G01R 31/3624 702/63 |
| 2013/0181681 A1* | 7/2013 | Mukai | H02J 7/0031 320/134 |

FOREIGN PATENT DOCUMENTS

| | | |
|---|---|---|
| JP | 7-198808 | 8/1995 |
| JP | 11-148966 | 6/1999 |
| JP | 11-233155 | 8/1999 |
| JP | 2001-281306 | 10/2001 |
| JP | 2004-301783 | 10/2004 |
| JP | 2006-197727 | 7/2006 |
| JP | 2010-19595 | 1/2010 |
| JP | 2012-247374 | 12/2012 |
| WO | WO99/45404 | 9/1999 |

OTHER PUBLICATIONS

Official Action for JP Appl. No. 2013-008171 dated Mar. 15, 2016.

* cited by examiner

| CCV UPON CHARGING | STATE OF CHARGE SOC [%] |
|---|---|
| cm00 | 0 |
| cm01 | 5 |
| cm02 | 10 |
| cm03 | 15 |
| cm04 | 20 |
| cm05 | 25 |
| cm06 | 30 |
| ⋮ | ⋮ |
| cm17 | 85 |
| cm18 | 90 |
| cm19 | 95 |
| cm20 | 100 |

502

| CCV UPON DISCHARGING | STATE OF CHARGE SOC [%] |
|---|---|
| dm00 | 0 |
| dm01 | 5 |
| dm02 | 10 |
| dm03 | 15 |
| dm04 | 20 |
| dm05 | 25 |
| dm06 | 30 |
| ⋮ | ⋮ |
| dm17 | 85 |
| dm18 | 90 |
| dm19 | 95 |
| dm20 | 100 |

| CCV UPON CHARGING | | | STATE OF CHARGE SOC [%] |
|---|---|---|---|
| 100V | 200V | FAST CHARGE | |
| cm00 | cn00 | cr00 | 0 |
| cm01 | cn01 | cr01 | 5 |
| cm02 | cn02 | cr02 | 10 |
| cm03 | cn03 | cr03 | 15 |
| cm04 | cn04 | cr04 | 20 |
| cm05 | cn05 | cr05 | 25 |
| cm06 | cn06 | cr06 | 30 |
| ⋮ | ⋮ | ⋮ | ⋮ |
| cm17 | cn17 | cr17 | 85 |
| cm18 | cn18 | cr18 | 90 |
| cm19 | cn19 | cr19 | 95 |
| cm20 | cn20 | cr20 | 100 |

F I G. 7

F I G. 8

STATE-OF-CHARGE ESTIMATION DEVICE AND STATE-OF-CHARGE ESTIMATION METHOD

FIELD

The present invention relates to a state-of-charge estimation device and a state-of-charge estimation method which estimate a state of charge.

BACKGROUND

Measuring a closed circuit voltage (CCV) and estimating an open circuit voltage (OCV) by use of the measured closed circuit voltage so as to estimate a state of charge (SOC) by use of the open circuit voltage is a known method for estimating a state of charge in a battery.

However, for a secondary battery which requires a long time until polarization is dissipated, it is difficult to estimate a state of charge accurately from an open circuit voltage because the battery has a large hysteresis upon charging/discharging in its SOC-OCV characteristics. A secondary battery in which, for example, SiO (silicon monoxide) is used for a negative electrode is a known secondary battery requiring a long time until polarization is dissipated.

Further, a remaining rechargeable-battery capacity detecting device which detects a remaining capacity in a rechargeable battery accurately is a known technology for estimating a state of charge. See, for example, Patent Document 1.

Patent Document 1: Japanese Laid-open Patent Publication No. 2001-281306

SUMMARY

The present invention has been accomplished in light of the problem described above, and an object of the invention is to provide a state-of-charge estimation device and a state-of-charge estimation method which accurately estimate a state of charge in a battery having a large polarization, requiring a long time for depolarization, and having a large charge/discharge hysteresis in its SOC-OCV characteristics.

According to an aspect of the invention, a state-of-charge estimation device includes a voltage measuring unit, a charge estimation unit, and a discharge estimation unit. The voltage measuring unit measures a closed circuit voltage in a battery.

The charge estimation unit estimates a state of charge in a charge mode by referring to charge mode information that associates a closed circuit voltage with a state of charge in the battery by use of the measured closed circuit voltage when constant current charging is performed by a charger.

The discharge estimation unit estimates a state of charge in a discharge mode by referring to discharge mode information that associates a closed circuit voltage generated by use of a discharge pattern of the battery obtained by operating a vehicle in a predetermined operation pattern with a state of charge in the battery by use of the measured closed circuit voltage.

According to embodiments of the present invention, an advantage is provided such that a state of charge is accurately estimated in a battery having a large polarization, requiring a long time for depolarization, and having a large charge/discharge hysteresis in its SOC-OCV characteristics.

DESCRIPTION OF EMBODIMENTS

Embodiments of the present invention will now be described in detail with reference to the drawings.

A first embodiment will now be described.

Figure 1:
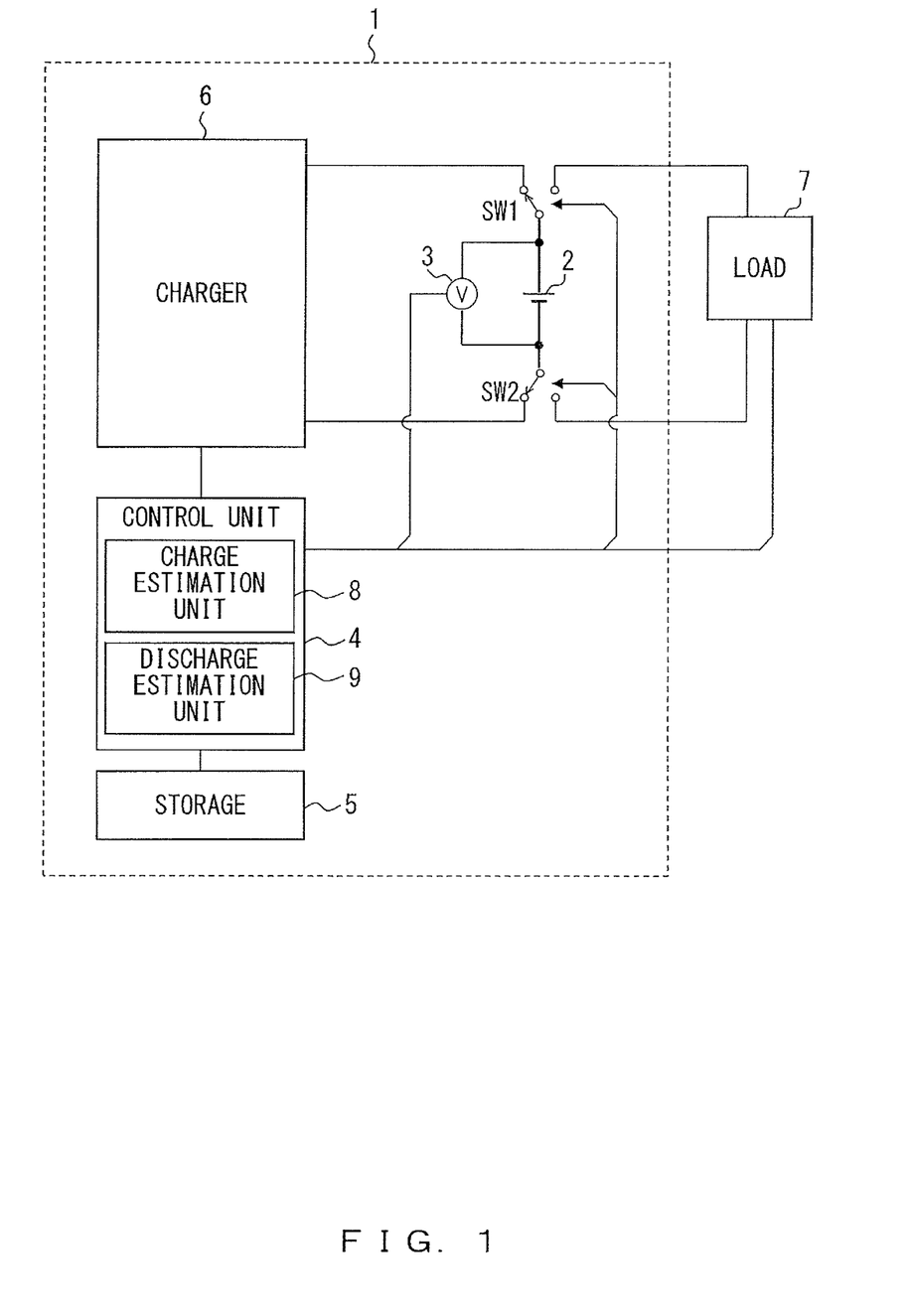
FIG. 1 is an example of a charging/discharging apparatus.

FIG. 1 is an example of a charging/discharging apparatus. The charging/discharging apparatus 1 in FIG. 1 has a state-of-charge estimation device and includes, for example, a battery 2, a voltage measuring unit 3, a control unit 4, a storage 5, a charger 6, and switches SW1 and SW2. A load 7 in FIG. 1 is a device that is operable by receiving power from the charging/discharging apparatus 1. For example, the operable device may be a motor equipped on a vehicle.

The state-of-charge estimation device includes, for example, the voltage measuring unit 3, the control unit 4, the storage 5, and the switches SW1 and SW2.

The battery 2 is, for example, a secondary battery having a large polarization, requiring a long time for depolarization, and having a large charge/discharge hysteresis. The secondary battery may be, for example, a lithium-ion secondary battery in which a SiO negative electrode is used as a negative electrode. However, it is not limited to a lithium-ion secondary battery in which a SiO is used for a negative electrode.

Figure 2:
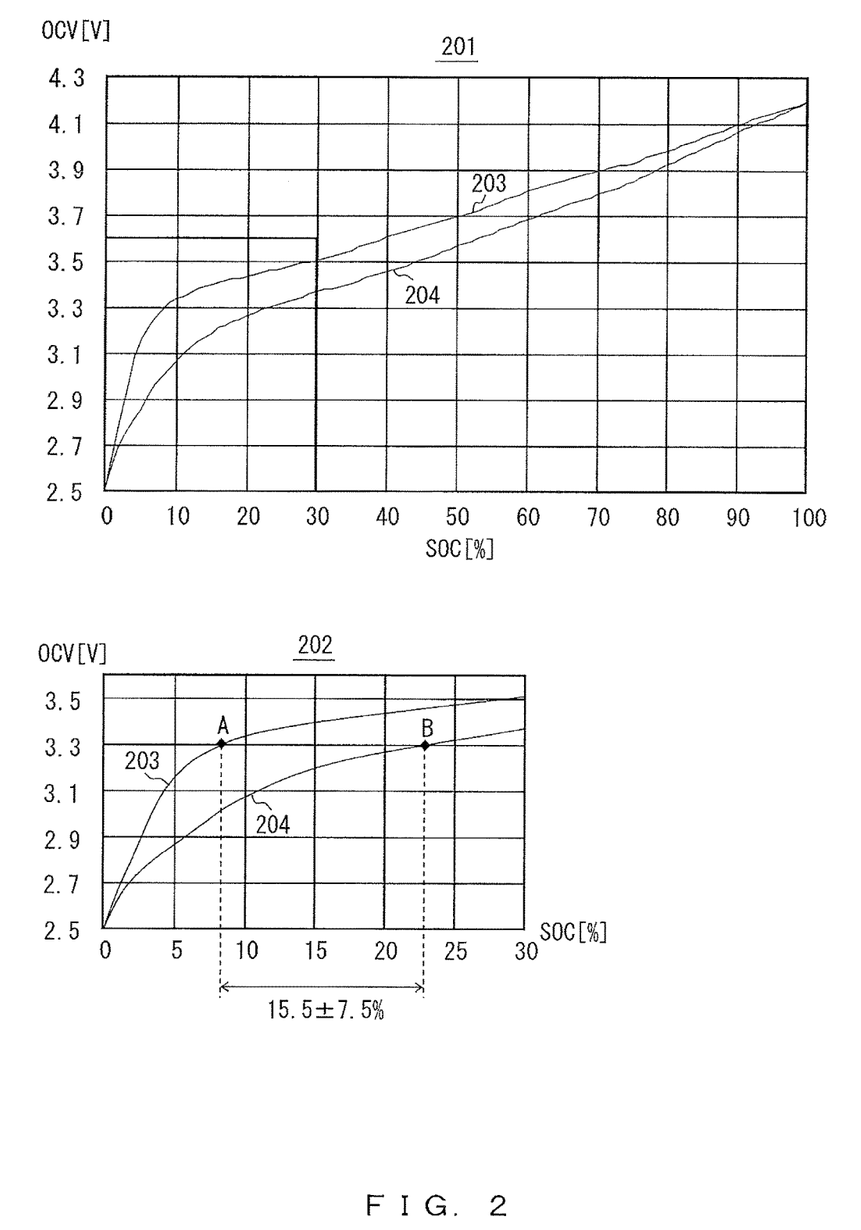
FIG. 2 is a set of graphs which represent examples of SOC-OCV characteristics upon charging/discharging.

A secondary battery according to the embodiments, having a large polarization, requiring a long time for depolarization, and having a large charge/discharge hysteresis, will now be described. FIG. 2 is a set of graphs which represent examples of SOC-OCV characteristics upon charging/discharging. The graphs 201 and 202 in FIG. 2 having an open circuit voltage (OCV [V]) on the ordinate and a state of charge (SOC [%]) on the abscissa represent a state in which three hours have passed at 25° C. since de-energizing. The SOC-OCV characteristics upon charging are represented by a curve 203, and the SOC-OCV characteristics upon discharging are represented by a curve 204.

A secondary battery having a large polarization is, for example, a secondary battery whose polarization is larger than that of a conventional secondary battery in which a carbon negative electrode is used as a negative electrode.

As seen in an example of the graph 202, if a secondary battery with a SiO negative electrode is used, a difference in state of charge (hysteresis) between points A and B when an open circuit voltage indicates 3.3 [V] upon charging/discharging is 15.5±7.5[%]. This means that the states of charge of point A on the curve 203 and point B on the curve 204 are 7.5[%] away from 15.5[%], which is an average state of charge of points A and B. In addition, it is assumed that, for a secondary battery with a carbon negative electrode, in a state in which three hours has passed at 25° C. since de-energizing, 4.4±0.2[%] has been obtained as a result of measuring a difference in state of charge (hysteresis) when an open circuit voltage indicates 3.3 [V] upon charging/discharging. In this case, the difference in state of charge in the secondary battery with a SiO negative electrode is greater than the difference in state of charge in the secondary battery with a carbon negative electrode, with the result that the secondary battery with a SiO negative electrode has a large polarization. According to the embodiment, the differences in state of charge that are obtained when an open circuit voltage indicates 3.3 [V] upon charging/discharging are used for comparison, but the open circuit voltage when a difference in state of charge becomes maximum is not limited to 3.3 [V].

A secondary battery requiring a long time for depolarization is, for example, a secondary battery which requires a time for depolarization longer than that required by a conventional secondary battery in which a carbon negative electrode is used as a negative electrode. If polarization of a secondary battery with a carbon negative electrode is dissipated, for example, within ten minutes, a secondary battery in which polarization is still not dissipated after a lapse of more than ten minutes is a secondary battery requiring a long time for depolarization. More specifically, if polarization is still not dissipated after a lapse of more than ten minutes and a state of charge obtained from SOC-OCV characteristics is not less than ±1[%], it is a secondary battery which requires a long time for depolarization. This is a case in which states of charge of a point on a curve upon charging and a point on a curve upon discharging are more than or equal to 1[%] away from an average state of charge of each of the points.

FIG. 1 describes an example using one battery, but it is not limited to one battery, and a plurality of batteries may be used.

The voltage measuring unit 3 measures a voltage in the battery 2. It may be, for example, a voltmeter. Data measured by the voltage measuring unit 3 is output to the control unit 4.

A CPU (central processing unit), a multicore CPU, a programmable device (field programmable gate array, FPGA), and/or PLD (programmable logic device) may be used to configure the control unit 4 (such as a computer).

The storage 5 may be a memory or a hard disk such as a read only memory (ROM) and a random access memory (RAM). The storage 5 may store thereon data such as a parameter value and a variable value, or may be used as a work area upon execution. The storage 5 may not be used when the control unit 4 has a storage.

The charger 6 is a device which receives power from a power supply device to charge the battery 2.

The switches SW1 and SW2 switch charging and discharging according to an instruction from the control unit 4, in which a relay may be used, for example. According to the embodiment, the two switches, SW1 and SW2, are used to switch between charging and discharging, but embodiments are not limited to the circuit illustrated in FIG. 1.

The control unit will now be described.

The control unit 4 has a charge estimation unit 8 which estimates a state of charge in a charge mode by referring to charge mode information by use of a closed circuit voltage in the battery 2 measured by the voltage measuring unit 3. The charge mode is a mode in which the battery 2 is being charged from the outside through the charger 6. The charge mode information is information that associates a closed circuit voltage with a state of charge in the battery 2 when constant current charging is performed by the charger 6.

Further, the control unit 4 has a discharge estimation unit 9 which estimates a state of charge in a discharge mode by referring to discharge mode information by use of the measured closed circuit voltage. The discharge mode is a mode in which a vehicle is traveling. The discharge mode information is information that associates a closed circuit voltage generated by use of a discharge pattern of the battery 2 obtained by operating, for example, a vehicle in a predetermined operation pattern with a state of charge in the battery.

The storage 5 may store thereon the charge mode information and the discharge mode information.

A relationship between closed circuit voltages and states of charge in the charge mode information and the discharge mode information will now be described.

Figure 3:
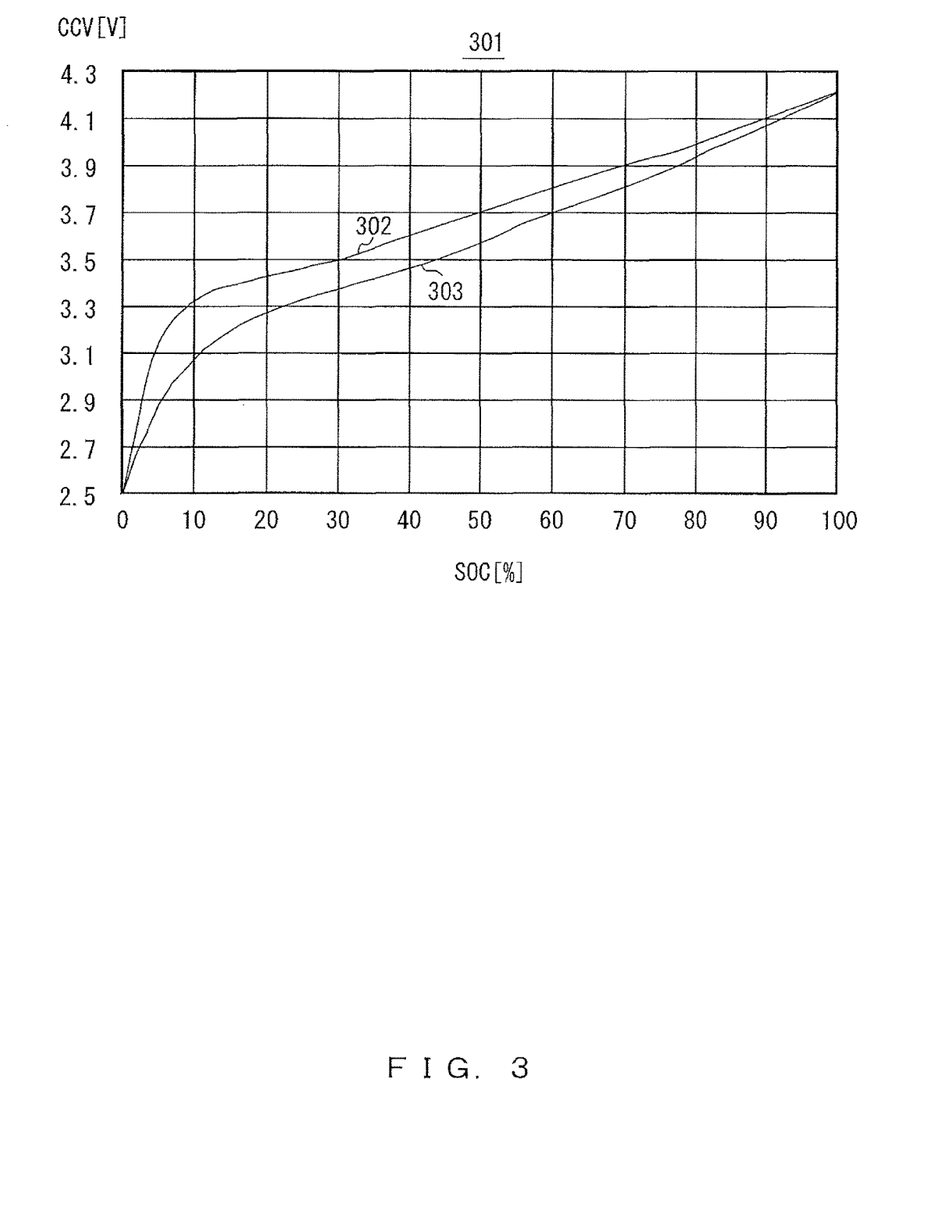
FIG. 3 is a graph which represents an example of SOC-OCV characteristics upon charging/discharging.

FIG. 3 is a graph which represents an example of SOC-CCV characteristics upon charging/discharging. A curve 302 in the graph 301 in FIG. 3 which represents SOC-CCV characteristics depicts a relationship between a closed circuit voltage and a state of charge in the battery 2 when constant current charging is performed by the charger 6. The relationship between a closed circuit voltage and a state of charge in a charge mode is obtained by, for example, an experiment or a simulation.

A curve 303 in the graph 301 represents a relationship between a closed circuit voltage generated by use of a discharge pattern of the battery 2 obtained by operating, for example, a vehicle in a predetermined operation pattern and a state of charge.

The predetermined operation pattern may be, for example, the JC-08 mode or the LA#4 mode, which is a method for measuring fuel efficiency by a traveling pattern when the vehicle is an electric vehicle (EV) or a plug-in hybrid vehicle (PHV). When the vehicle is a forklift, a predetermined traveling pattern or working pattern may be used.

The discharge pattern is a pattern of a closed circuit voltage upon discharging in a battery, such as the battery 2, equipped on a vehicle, when the vehicle is operated in a travelling pattern or a working pattern. A relationship between a closed circuit voltage and a state of charge in a discharge mode is obtained by an experiment or a simulation by use of the closed circuit voltage upon discharging.

An operation of the control unit will now be described.

Figure 4:
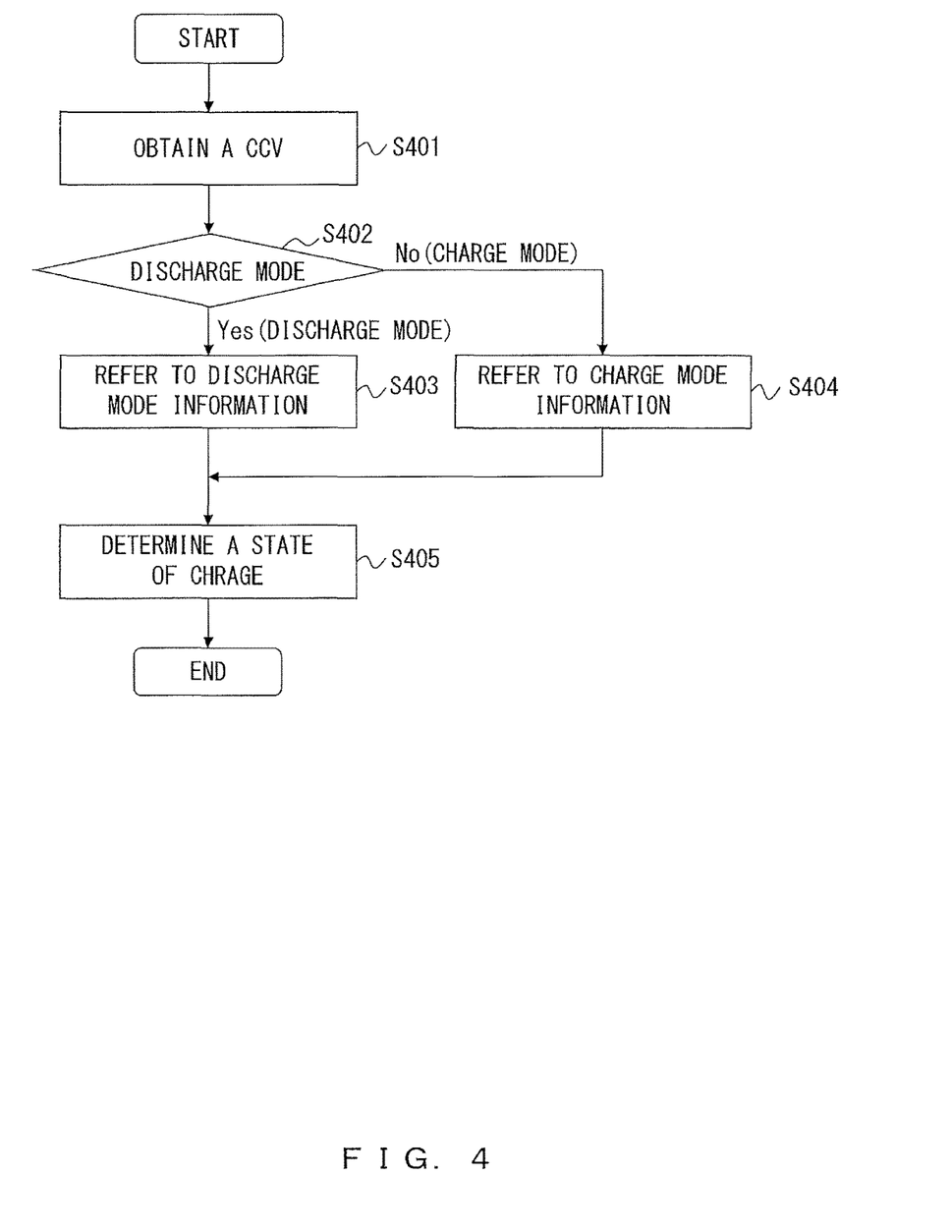
FIG. 4 is a flowchart which represents an example of an operation according to a first embodiment.

FIG. 4 is a flowchart which represents an example of an operation according to the first embodiment. In Step S401, the control unit 4 obtains a closed circuit voltage from the voltage measuring unit 3. In Step S402, the control unit 4 determines whether a mode is a discharge mode or a charge mode. The process goes to Step S403 when it is a discharge mode (Yes), and the process goes to Step S404 when it is a charge mode (No).

In Step S403, the control unit 4 obtains a state of charge which corresponds to the closed circuit voltage obtained from the voltage measuring unit 3 by referring to the discharge mode information. In Step S404, the control unit 4 obtains a state of charge which corresponds to the closed circuit voltage obtained from the voltage measuring unit 3 by referring to the charge mode information. In Step S405, the control unit 4 determines a state of charge.

Figure 5:
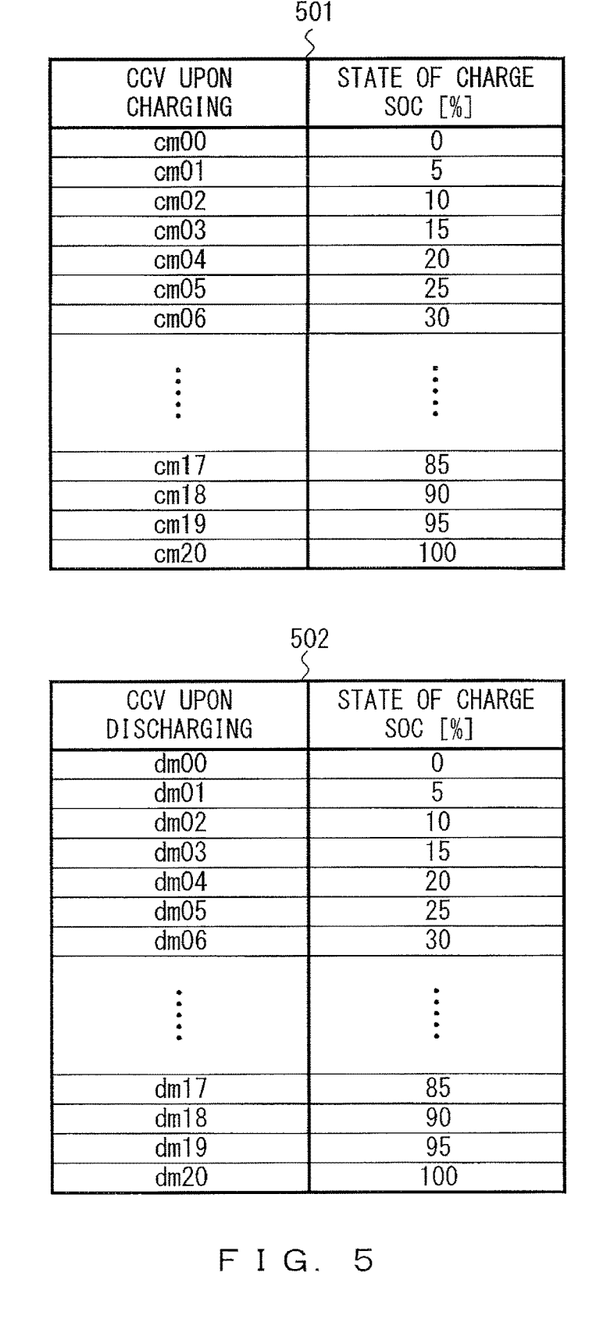
FIG. 5 is a set of tables which represent examples of data structures of charge mode information and discharge mode information.

FIG. 5 is a set of tables which represent examples of data structures of the charge mode information and the discharge mode information. The charge mode information 501 includes information stored in "CCV UPON CHARGING" for a closed circuit voltage upon charging and in "STATE OF CHARGE SOC [%]" for a state of charge corresponding to the closed circuit voltage. According to the embodiment, "CCV UPON CHARGING" stores therein information representing closed circuit voltages "cm00", "cm01", "cm02", "cm03", "cm04", "cm05", "cm06" . . . "cm17", "cm18", "cm19", and "cm20". According to the embodiment, "STATE OF CHARGE SOC [%]" stores therein information representing states of charge "0", "5", "10", "15", "20", "25", "30" . . . "85", "90", "95", and "100" in association with the closed circuit voltages.

The discharge mode information 502 includes information stored in "CCV UPON DISCHARGING" for a closed circuit voltage upon discharging and "STATE OF CHARGE SOC [%]" for a state of charge corresponding to the closed circuit voltage. According to the embodiment, "CCV UPON DISCHARGING" stores therein information representing closed circuit voltages "dm00", "dm01", "dm02", "dm03", "dm04", "dm05", "dm06" . . . "dm17", "dm18", "dm19", and "dm20". According to the embodiment, "STATE OF CHARGE SOC [%]" stores therein information representing states of charge "0", "5", "10", "15", "20", "25", "30" . . . "85", "90", "95", and "100" in association with the closed circuit voltages.

According to the first embodiment, an advantage is provided such that a state of charge is accurately estimated in a battery having a large polarization, requiring a long time for depolarization, and having a large charge/discharge hysteresis in its SOC-OCV characteristics by changing information used for estimation between charging and discharging.

A second embodiment will now be described.

Figure 6:
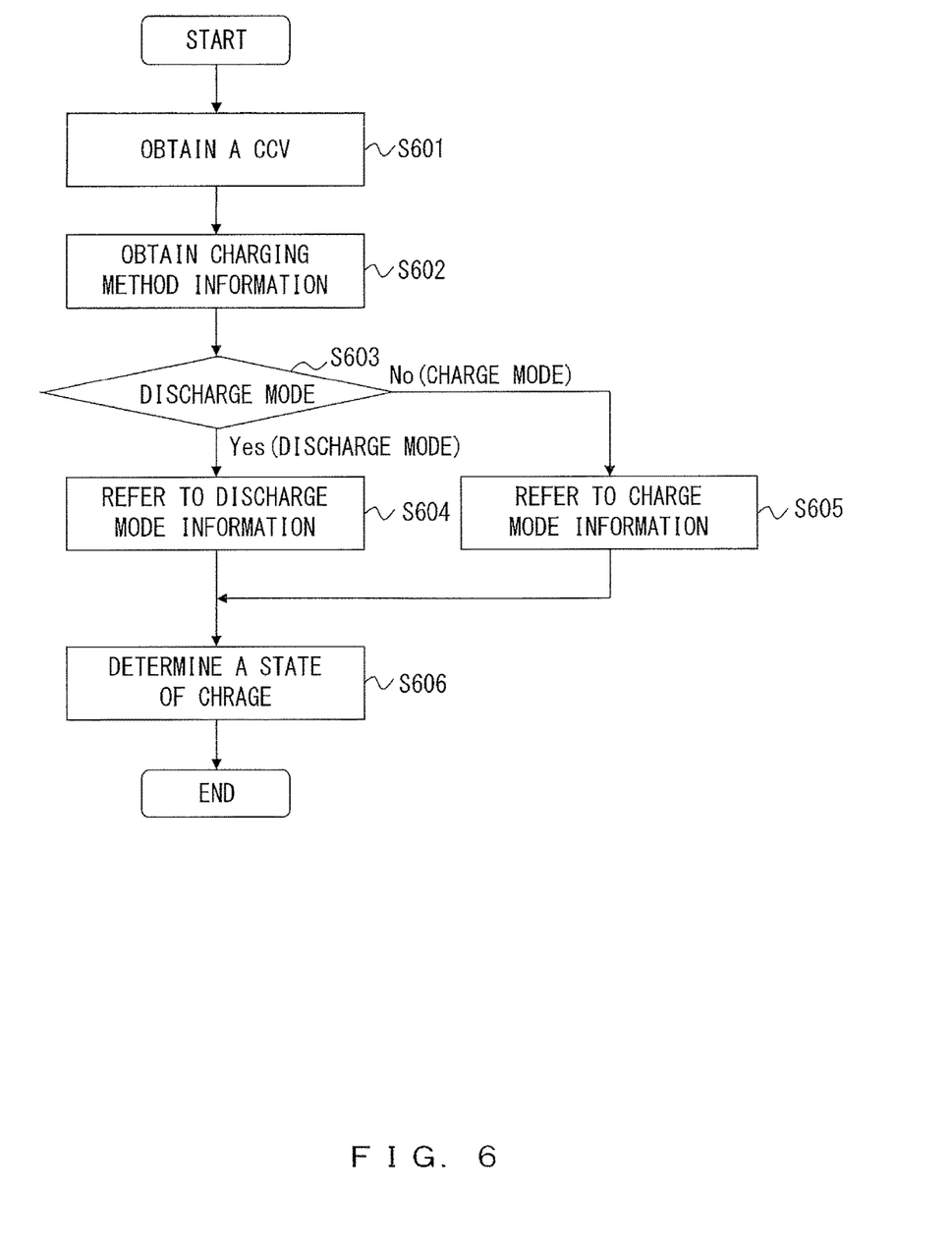
FIG. 6 is a flowchart which represents an example of an operation according to a second embodiment.

In the second embodiment, the charge mode information is provided for each charging method. FIG. 6 is a flowchart which represents an example of an operation according to the second embodiment. In Step S601, the control unit 4 obtains a closed circuit voltage from the voltage measuring unit 3. In Step S602, the control unit 4 obtains charging method information. The charging method information represents a charging method and includes information representing, for example, a charge at 100 V, a charge at 200 V, and a fast charge. When charged at 100 V, the control unit 4 obtains the charging method information, including information which represents a charge at 100 V.

In Step S603, the control unit 4 determines whether a mode is a discharge mode or a charge mode. The process goes to Step S604 when it is a discharge mode (Yes), and the process goes to Step S605 when it is a charge mode (No).

In Step S604, the control unit 4 obtains a state of charge which corresponds to the closed circuit voltage obtained from the voltage measuring unit 3 by referring to the discharge mode information used in the first embodiment. In Step S605, the control unit 4 obtains a state of charge which corresponds to the closed circuit voltage obtained from the voltage measuring unit 3 by referring to the charge mode information to be used in the second embodiment. In Step S606, the control unit 4 determines a state of charge.

Figure 7:
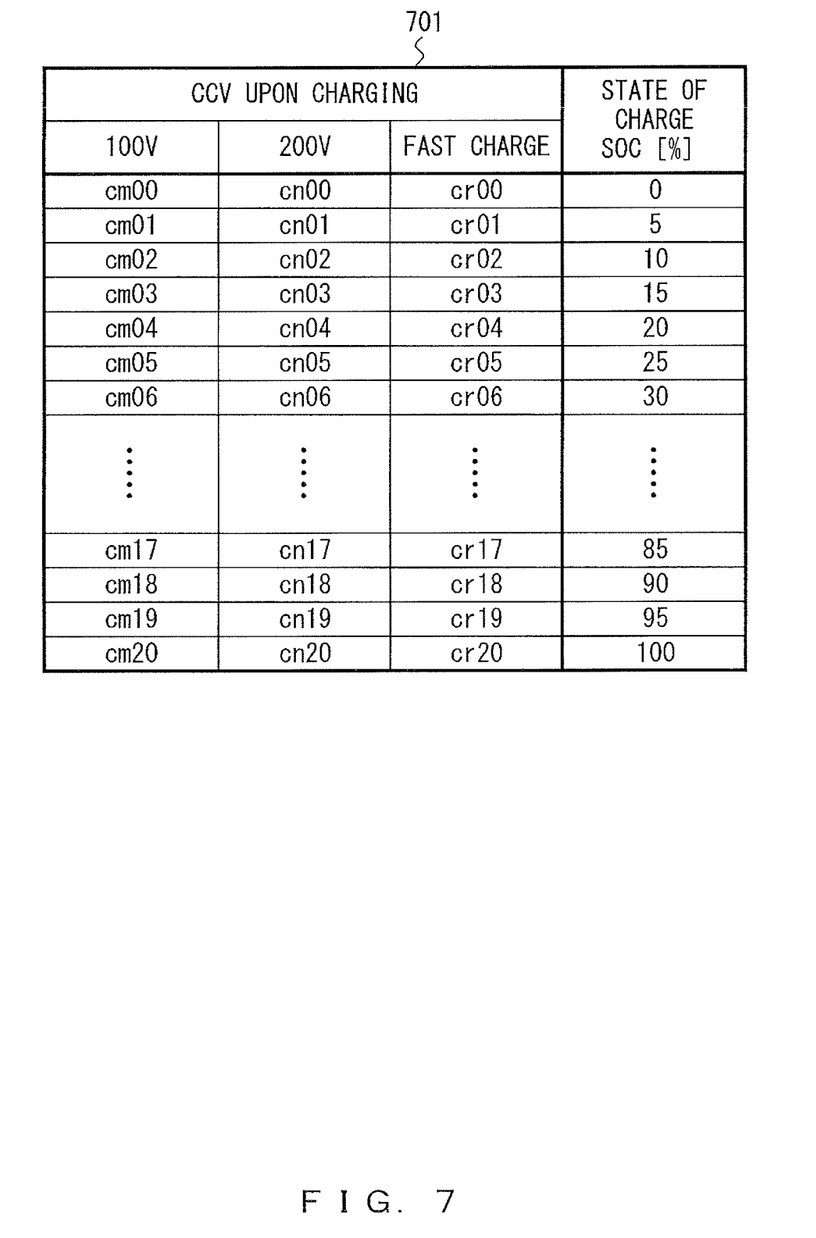
FIG. 7 is a table which represents an example of a data structure of charge mode information according to the second embodiment.

FIG. 7 is a table which represents an example of a data structure of the charge mode information according to the second embodiment. The charge mode information 701 includes information stored in "CCV UPON CHARGING" for a closed circuit voltage upon charging and "STATE OF CHARGE SOC [%]" for a state of charge corresponding to the closed circuit voltage. "CCV UPON CHARGING" includes "100 V", which stores therein a closed circuit voltage when charging at 100 V, "200 V", which stores therein a closed circuit voltage when charging at 200 V, and "FAST CHARGE", which stores therein a closed circuit voltage when charging fast.

According to the embodiment, "100 V" stores therein information representing closed circuit voltages "cm00", "cm01", "cm02", "cm03", "cm04", "cm05", "cm06" . . . "cm17", "cm18", "cm19", and "cm20". "200 V" stores therein information representing closed circuit voltages "cn00", "cn01", "cn02", "cn03", "cn04", "cn05", "cn06" . . . "cn17", "cn18", "cn19", and "cn20". "FAST CHARGE" stores therein information representing closed circuit voltages "cr00", "cr01", "cr02", "cr03", "cr04", "cr05", "cr06" . . . "cr17", "cr18", "cr19", and "cr20". According to the embodiment, "STATE OF CHARGE SOC [%]" stores therein information representing states of charge "0", "5", "10", "15", "20", "25", "30" . . . "85", "90", "95", and "100", in association with pieces of the information representing the closed circuit voltages stored in each of "100 V", "200 V", and "FAST CHARGE".

According to the second embodiment, an advantage is provided such that a state of charge is accurately estimated in a battery having a large polarization, requiring a long time for depolarization, and having a large charge/discharge hysteresis in its SOC-OCV characteristics by changing information used for estimation between charging and discharging.

If a secondary battery has different SOC-OCV characteristics upon discharging for each charging method, a closed circuit voltage may be stored for each charging method so as to use discharge mode information which associates the stored closed circuit voltage with a state of charge.

A third embodiment will now be described.

In the third embodiment, a variability of the measured closed circuit voltage is corrected so as to improve the accuracy of estimating a state of charge. A factor which provides a variability of closed circuit voltage includes a current load, a temperature of the battery 2 or around the battery 2, a battery capacity, and a degradation of the battery 2.

Figure 8:
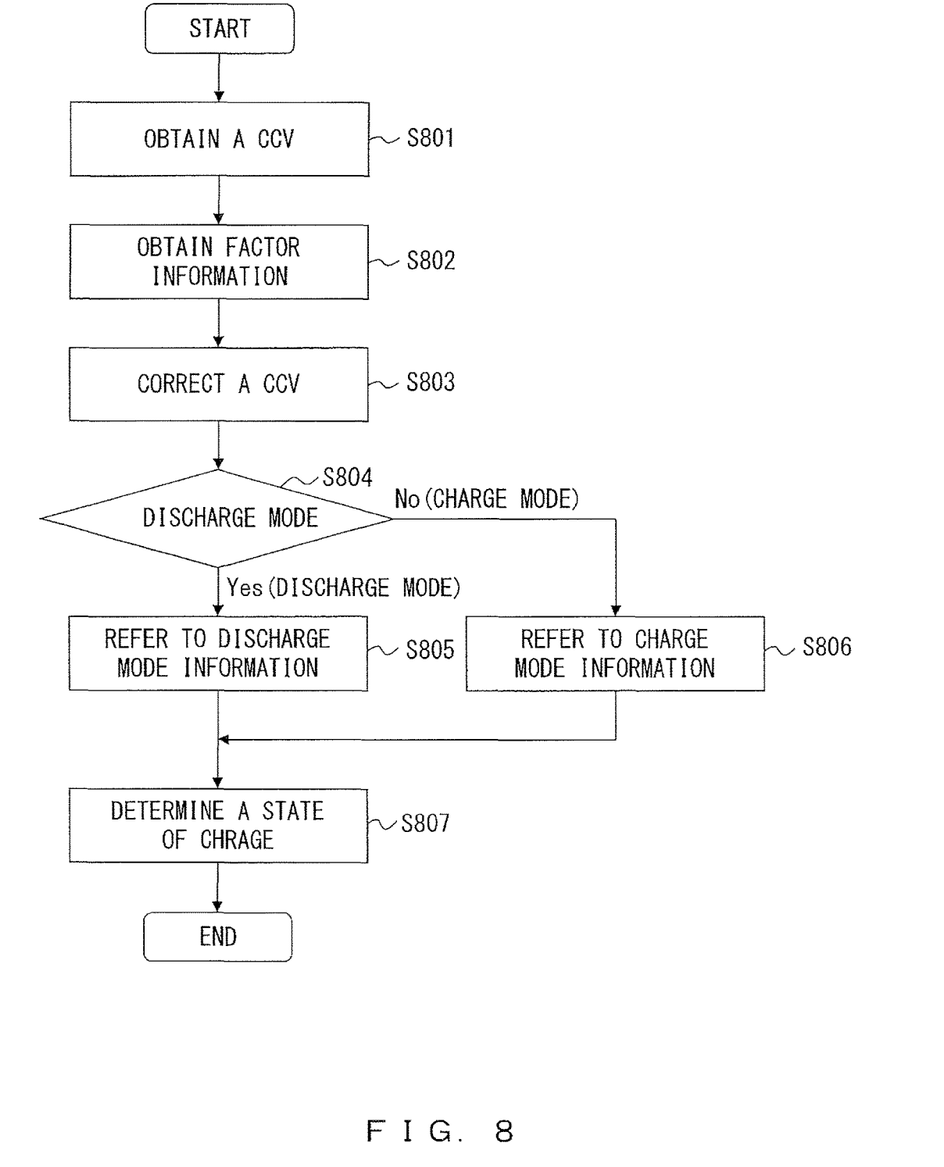
FIG. 8 is a flowchart which represents an example of an operation according to a third embodiment.

FIG. 8 is a flowchart which represents an example of an operation according to the third embodiment. In Step S801, the control unit 4 obtains a closed circuit voltage from the voltage measuring unit 3. In Step S802, the control unit 4 obtains factor information. The factor information includes information representing a current load, a temperature of the battery 2 or around the battery 2, a battery capacity, and a degradation of the battery 2. In Step S803, the control unit 4 obtains correction coefficients which respectively correspond to each piece of information included in the factor information so as to correct the measured closed circuit voltage by use of the correction coefficient. For example, when there is a change in current load, a correction coefficient corresponding to the current load stored on, for example, the storage 5 is obtained and the measured closed circuit voltage is multiplied by the correction coefficient so as to correct the measured closed circuit voltage.

In Step S804, the control unit 4 determines whether a mode is a discharge mode or a charge mode. The process goes to Step S805 when it is a discharge mode (Yes), and the process goes to Step S806 when it is a charge mode (No).

In Step S805, the control unit 4 obtains a state of charge which corresponds to the corrected closed circuit voltage by referring to the discharge mode information used in the first embodiment. In Step S806, the control unit 4 obtains a state of charge which corresponds to the corrected closed circuit voltage by referring to the charge mode information used in the first embodiment. In Step S807, the control unit 4 determines a state of charge.

According to the third embodiment, an advantage is provided such that a state of charge is accurately estimated in a battery having a large polarization, requiring along time for depolarization, and having a large charge/discharge hysteresis in its SOC-OCV characteristics by changing information used for estimation between charging and discharging.

If a secondary battery has a different SOC-OCV characteristic upon discharging for each charging method, a closed circuit voltage may be stored for each charging method so as to use discharge mode information that associates the stored closed circuit voltage with a state of charge.

The present invention is not limited to the embodiments described above, and various modifications and alterations may be made thereto without departing from the spirit and scope of the invention.

What is claimed is:

1. A state-of-charge estimation device operable to provide an estimated state of charge for a battery, the state-of-charge estimation device comprising:
    a voltmeter configured to measure a closed circuit voltage in the battery;
    a plurality of switches operable to connect the battery to a load in a discharge mode and operable to connect the battery to a charger in a charge mode;
    a memory storing both a plurality of charging SOC-CCV curves corresponding to a plurality of different charging methods that associates closed circuit charging voltages with states of charge in the battery when constant current charging is performed by the charger, and a discharging SOC-CCV curve that associates closed circuit discharging voltages generated by use of a discharge pattern of the battery obtained by operating a vehicle in a predetermined operation pattern with states of charge in the battery, wherein the plurality of charging SOC-CCV curves are different from the discharging SOC-CCV curve,
    a central processing unit (CPU) operable to estimate a charge-mode state of charge of the battery when the battery is in the charge mode by utilizing the closed circuit voltage measured in the charge mode to identify a charging SOC-CCV curve of the plurality of charging SOC-CCV curves indicating an estimated charge-mode state of charge for the battery that is associated with the measured closed circuit voltage;
    wherein the central processing unit (CPU) is operable to estimate a discharge-mode state of charge of the battery when the battery is in the discharge mode by utilizing the closed circuit voltage measured in the discharge mode to identify the discharging SOC-CCV curve a indicating an estimated discharge-mode stage of charge for the battery that is associated with the measured closed circuit voltage, and
    wherein the central processing unit (CPU) is further operable to
        determine whether the battery is in the charge mode or the discharge mode, and
        determine the estimated state of charge for the battery as the estimated charge-mode state of charge when the battery is in the charge mode, and determine the estimated state of charge for the battery as the estimated discharge-mode state of charge when the battery is in the discharge mode,
    wherein the central processing unit (CPU) estimates the state of charge by referring to the charging SOC-CCV curve which corresponds to information representing the charging method from among the plurality of charging SOC-CCV curves, and estimates the state of charge using the closed circuit voltage measured in the charge mode.

2. The state-of-charge estimation device according to claim 1, comprising:
    obtaining information on a factor which provides a variability of the measured closed circuit voltage;
    obtaining a correction coefficient which corresponds to the obtained factor information to correct the closed circuit voltage; and
    correcting the closed circuit voltage by use of the correction coefficient.

3. The state-of-charge estimation device according to claim 1, wherein the battery is a lithium-ion secondary battery with a SiO negative electrode.

* * * * *